United States Patent [19]

Williamson

[11] Patent Number: 4,873,485
[45] Date of Patent: Oct. 10, 1989

[54] ELECTRO-OPTIC SIGNAL MEASUREMENT

[75] Inventor: Steven L. Williamson, Henrietta, N.Y.

[73] Assignee: The University of Rochester, Rochester, N.Y.

[21] Appl. No.: 218,178

[22] Filed: Jul. 13, 1988

[51] Int. Cl.$^4$ .................. G01R 19/00; G01R 19/155
[52] U.S. Cl. .................................... 324/96; 324/109; 350/354; 350/355
[58] Field of Search ............... 324/96, 109, 354, 355; 350/356, 370, 376, 96.15

[56] References Cited
U.S. PATENT DOCUMENTS

| | | |
|---|---|---|
| 4,446,425 | 5/1984 | Valdmanis et al. |
| 4,482,863 | 11/1984 | Auston. |
| 4,525,687 | 6/1985 | Chemla et al. ............. 350/355 |
| 4,603,293 | 7/1986 | Mourou. |
| 4,618,819 | 10/1986 | Mourou. |
| 4,681,449 | 7/1987 | Bloom. |
| 4,761,620 | 8/1988 | Bar-Joseph et al. ........ 350/354 |

OTHER PUBLICATIONS

"Electro-Optic Sampling: Jesting Picosecond Electronics" by Valdmanis et al, Laser Focus/Electro-Optics, 3/86, pp. 96-103.
T. E. Van Eck et al, Appl. Phys. Lett. 49(3); Jul. 1986, pp. 135 & 136.
D. S. Chelma, et al, Chapt. 5, pp. 279-318, in Text "Semiconductors & SemiMetals", 1987.

Primary Examiner—Reinhard J. Eisenzopf
Assistant Examiner—W. Burns
Attorney, Agent, or Firm—Martin LuKacher

[57] ABSTRACT

Direct voltage measurements of electrical signals are extracted from transmission lines for display in a manner to permit such measurements with picosecond temporal and submicron spatial resolution utilizing a non-contacting electro-optic probe. The probe may have multiple quantum well (MQW) structure. The NQW structure defines an active region sufficiently small (less than a micron if desired) in width so that it can be placed between neighboring lines on an integrated circuit. A short pulse laser beam is used to sense the absorption change at the time window of interest. The electroabsorption effect in the MQW structure is a nonlinear function of the strength of the electric field. Detection can be carried out by sampling techniques to provide the measurement of the voltage or the display of the signal. Problems arising from crosstalk from neighboring conductors or elements and the lack of bipolar response of the electroabsorption effect have been solved using a reference electrode on one side of the MQW structure to which a voltage is applied for developing a field that cancels the field due to the signal being measured, thereby providing a voltage signal corresponding both in amplitude and polarity to the actual signal on the transmission line.

26 Claims, 5 Drawing Sheets

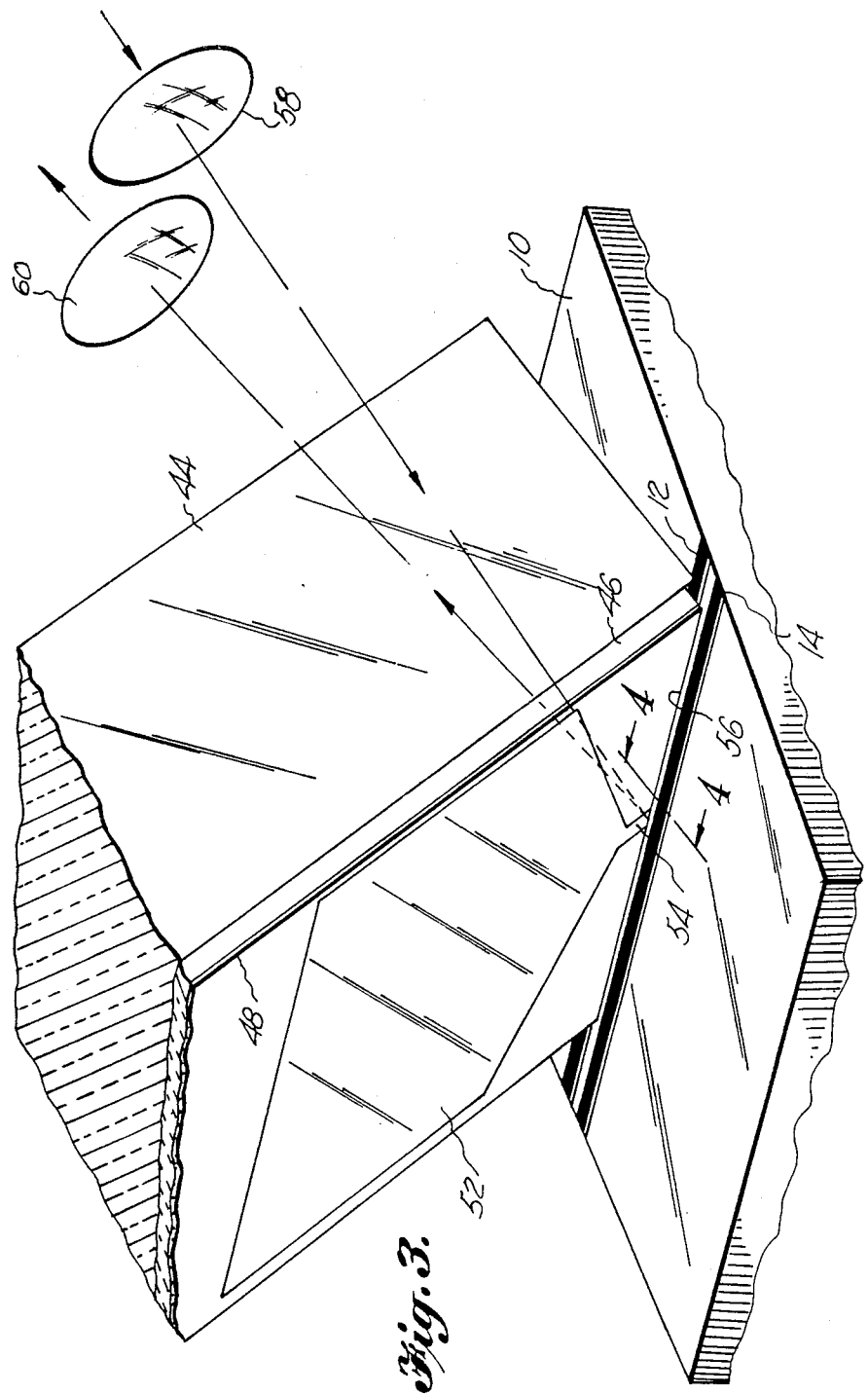

ELECTRO-OPTIC SIGNAL MEASUREMENT

DESCRIPTION

The present invention relates to an electro-optic measurement, and particularly to methods and apparatus for noncontact optical measurements of electrical signals on conductors (by which term is also meant electrodes, lines and other elements) which support such signals.

The invention is especially suitable for the measurement of electrical signals from submicron devices and structures such as integrated circuits wherein spatial resolution in the micron range and signal measurements with picosecond and even subpicosecond resolution are desired.

Electro-optic measurements of electrical signals have been made using electro-optic (E-O) crystals, the index of refraction of which changes in accordance with the strength of the electric field being measured. This signal may be propagated along a conductor. A sampling laser beam is focused into the crystal in the region of the fringing E-field. By electro-optic sampling, the signal can be extracted and displayed with picosecond and even subpicosecond resolution. The spatial resolution is determined by the size of the beam cross-section (laser spot) in the electro-optic crystal or electro-optic substrate when the crystal is used as such. Reference may be had to the following patents as well as to the articles referenced therein for further information with respect to the aforementioned electro-optic measurement approach: Mourou and Valdmanis, U.S. Pat. Nos. 4,446,425, May, 1984, and 4,618,819, October, 1986, and Mourou and Mayer, 4,603,293, July, 1986. Another patent issued July, 1987 as U.S. Pat. No. 4,618,449 also describes the techniques and system of the aforementioned Mourou, et al. patents.

Recent studies on multiple quantum well (MQW) devices have observed significant changes in optical absorption with applied electric field (electroabsorption). These studies are described in the following articles. T. P. Van Eck, et al., *Appl. Phys. Lett.* 49(3), 21 July 1986, 135 and D. S. Chemla, et al. Chapter 5, pages 279 to 318 in the text, *Semiconductors and Semimetals*, Vol. 24, copyright 1987, Bell Telephone Laboratories Incorporated.

Unlike the E-O crystals, MQW devices respond to an electric field by a change in absorption. In addition, an MQW device is not polarity sensitive and is, in effect, rectifying. Therefore, the polarity of the field cannot be measured directly with an MQW device. In addition, where there are neighboring field producing elements, the measurement may be subject to erroneous signals due to the fields from such neighboring conductors. This problem is exacerbated as the spacing of the conductors becomes extremely close as in submicron integrated circuit (IC) structures.

It has been discovered in accordance with the invention that a MQW device (also known as a MQW modulator) can be provided wherein substantially all absorption occurs within a region which allows exacting spatial resolution of the signal being measured. In other words, the signal can be extracted, in accordance with the invention, without making contact to the conductor and from a region of the conductor in the micron (or submicron) range. Specifically desired conductors or portions of conductors can be probed independent of conductor geometry. Absolute, bipolar measurements are also obtained using polarity insensitive electro-optic effects (electroabsorption). This allows such measurements to be made without the complexity of electron microscope voltage contrast measurement techniques where secondary electrons resulting from electron beam bombardment are electrostatically filtered in accordance with the field on conductors. The invention may also be used in electro-optic crystal (Pockels cell) electro-optic measurement systems. In this case, the longitudinal mode of operation is important. In the system described in the above-referenced U.S. Pat. No. 4,446,426, this mode is not used.

Accordingly, it is the principal object of the present invention to provide an improved system (method and apparatus) and devices for measurement of electrical signals which appear on conductors at spatial resolution in the micron range, which in principle, enable spatial resolution in the submicron range and with picosecond temporal resolution.

It is a still further object of the present invention to provide systems and devices for making measurements of signals on the conductive elements of submicron structures, such as integrated circuits, without contacting the conductors on which the signals appear, even where the conductors have micron range separations.

It is a still further object of the present invention to provide systems and devices for making absolute measurements of voltage on conductors with spatial resolution in the micron range in spite of the use of an electro-optic device which is not polarity sensitive, such as has a MQW structure.

It is a still further object of the invention to provide an improved system for making measurements of signals by responding electro-optically to the fields resulting from such signals in a manner which reduces measurement errors (due to erroneous signals such as produce noise or crosstalk) due to fields from neighboring conductors.

Briefly described, a system (method and apparatus) for measuring an electrical signal on a conductor at a predetermined location spatially of the conductor makes use of a probe of electro-optical material which is located in the electrical fringe field from the conductor at the location of interest. The probe is preferably a body (substrate) of transparent and preferably high resistivity semiconductor material having a surface on which a multiplicity of layers defining a MQW structure is disposed. The structure may extend to an edge of the surface of the substrate on which it is disposed so to allow placement of the MWQ probe within the region of the fringing field or the signal being measured. This region has, as a boundary, and an electrode of conductive material which has been deposited onto the MQW surface and extends into the E-field region. The electrode serves not only as a reference plane but also as a mirror to reflect a beam of light (which may be a pulsed beam when sampling techniques are used for signal measurement and display). The probe beam is focused into the region of interest and is reflected to a detector where it is converted into an electrical signal. This electrical signal may be filtered and amplified (as by using a lockin amplifier) before being inputed to a computer. The function of the computer is to read this lockin signal and reduce it to zero by adjusting the voltage amplitude and polarity applied to the reference plane. This signal is fed back to the reference plane and may be referred to as a reference or feedback signal. The reference signal has polarity and amplitude corresponding to the signal being measured. Accordingly, measurement of this feedback signal provides a measurement of the signal of interest. The reference electrode acts also to shield the electro-optic probe from unwanted fields caused by neighboring elements on the back side of the probe. By locating the probe to respond to such crosstalk producing fields, they can be measured and subtracted from the measurement of the signal of interest to reduce the effects of the crosstalk.

Consider that most integrated circuits (ICS) do not have grown planes. Conventional E-O sampling measures the field between adjacent electrodes which may be high or low or anything in between, and a measurement of an absolute voltage is not made. This invention enables, absolute voltage to be measured even in the absence of ground plane.

Also, most ICS have an $SiO_2$ passivation layer covering the entire circuit. Relying merely on fringing fields as with conventional E-O sampling results in virtually no field lines appearing within the E-O medium which adversely affects the measurement (reduces signal/-noise)! In accordance with the invention, fringing fields are drawn to the surface of the IC and and into the E-O medium as a result of the reference electrode which is in close proximity to the IC surface. Also the probe of the inventor presents low capacitive loading in all surrounding areas about the point under interrogation.

The foregoing and other objects, features and advantages of the present invention will become more apparent from a reading of the following description in connection with the accompanying drawings in which:

FIG. 3 is a fragmentary, diagrammatic perspective view of a probe in accordance with another embodiment of the invention;

Figure 1:
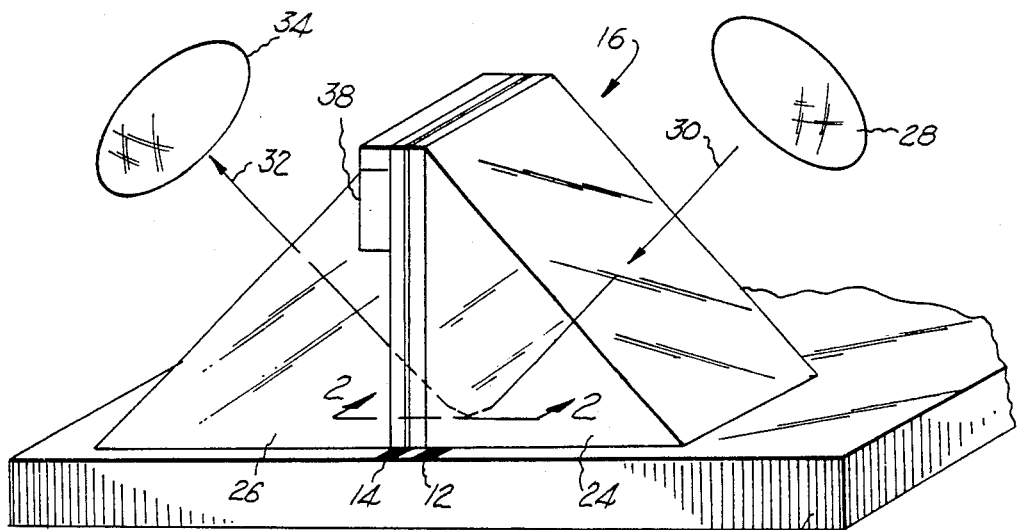
FIG. 1 is a diagrammatic, perspective view of a Probe for making measurements of electrical signals on conductors in accordance with the invention.
Figure 2:
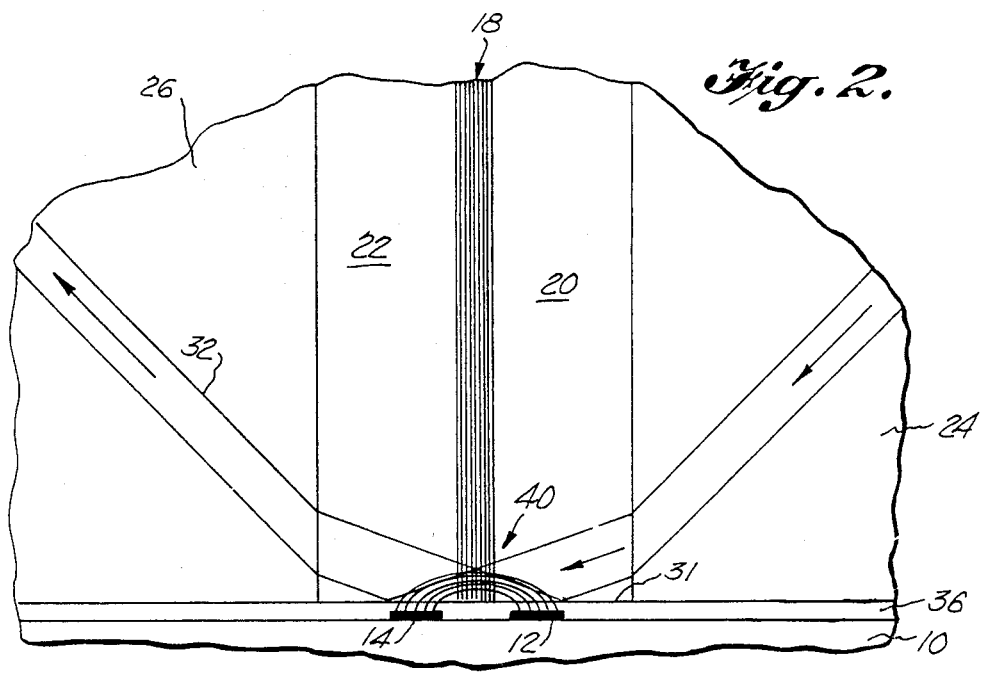
FIG. 2 is a fragmentary sectional view of the portion of the probe immediately adjacent to the electrode structure of conductors which produce the signal of interest and FIG. 2' is an insert enlarged to show the MWQ structure.
Figure 2:
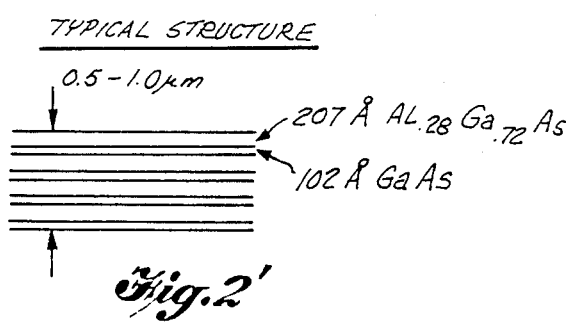

Referring more particularly to FIGS. 1 and 2, there is shown a substrate 10 on which electrodes 12 and 14 are located. These electrodes are typical conductors of the conductor arrays of an integrated circuit. They may be very closely spaced, for example one micron apart. To probe the fringe field from such an electrode structure, a probe system 16 is used. In this probe system, an MQW structure 18 is disposed between a semiconductor substrate 20 and superstrate 22. The substrate and superstrate are cemented by optical cement to glass prisms 24 and 26. A beam of light from a laser having a wavelength tuned to the absorption edge (exciton peak) for the MQW structure is focused by a lens 28 to provide a beam 30. The beam diameter is suitably in the micron range. The beam is reflected by total internal reflection from the end surface 30 of the substrate 20 and superstrate 22 and the MQW structure 18, which are polished after the prisms are cemented, to provide a smooth optically reflective surface. The output beam 32 is focused by a lens 34 on a photodetector and converted into an electrical signal. The field due to the signal in the conductors modulates the optical beam in accordance with the strength of the field and provides an output signal which is a measure of the amplitude of the optical signal.

The substrate and superstrate are AlGaAs which is transparent to the light beams 30 and 32. The MQW structure is provided by layers grown on top of the substrate 20 so that perfect single crystal quality is preserved with single monolayer precision. The layers are shown in greater detail in the insert (FIG. 2). The MQW assembly can be grown as thin as 500 Angstroms (2 pairs of wells) or as thick as a few microns (hundreds of pairs of wells) depending upon the ultimate spatial resolution required. As explained in the above-referenced articles, molecular beam epitaxy or metal-organic chemical vapor deposition, may be used to create the MQW structure. Molecular beam epitaxy for different durations may be used to control the MQW thickness. The superstrate, also of AlGaAs, is grown on top of the MQW structure. The region 40 where the optical beam and fringing field interact is the only active region of the structure. This region is quite small and fits between the conductors. Also because it is small, it can probe the fringe field and therefore the signal, at any location of the conductors thereby providing high spatial resolution. As shown by the gap 36 in FIG. 2, the probe is not in contact with the conductors.

Since high intensities of light or elevated temperatures can ionize the excitons that give rise to the steep absorption edge of the MQW structure, and therefore the sensitivity thereof as a modulator, it is desirable to maintain the temperature well below 350° K. This may be accomplished by a heat pump 38, which may be a Peltier junction device, which is space well above the region 40 where the beam and fields interact.

The prisms and the substrate 20 assure that the beam is near normal incidence to the layers which constitute the quantum wells. Also, the electrical field lines are perpendicular to the plane of the quantum wells. If beam paths which deviate from normal incidence significantly (e.g., 20° or more) are used, then it is preferable to use polarized light where the E vector of the light is parallel to the MQW planes.

Micron spatial resolution is determined by the width of the MQW structure rather than by the laser spot size. It is advantageous, however, to use a narrow diameter laser spot so that the greatest percentage of the laser beam interacts with the fringing fields, thereby maximizing the signal to noise ratio. Picosecond or sub-picosecond temporal resolution is achieved since the spot size of the short pulse laser is in the micron range. For example, for electrical signals which propagate along the conductors at a maximum propagation rate of 30 microns per picosecond, a five micron spot size dictates that the temporal resolution will be in the sub-picosecond range.

Another advantage of the system is the use of high resistivity semiconductor material which minimizes the capacitive loading on the circuit containing the conductors 12 and 14.

Figure 5:
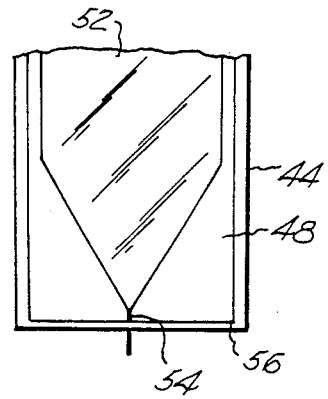
FIG. 5 is a fragmentary end view of the probe shown in FIG. 4.
Figure 4:
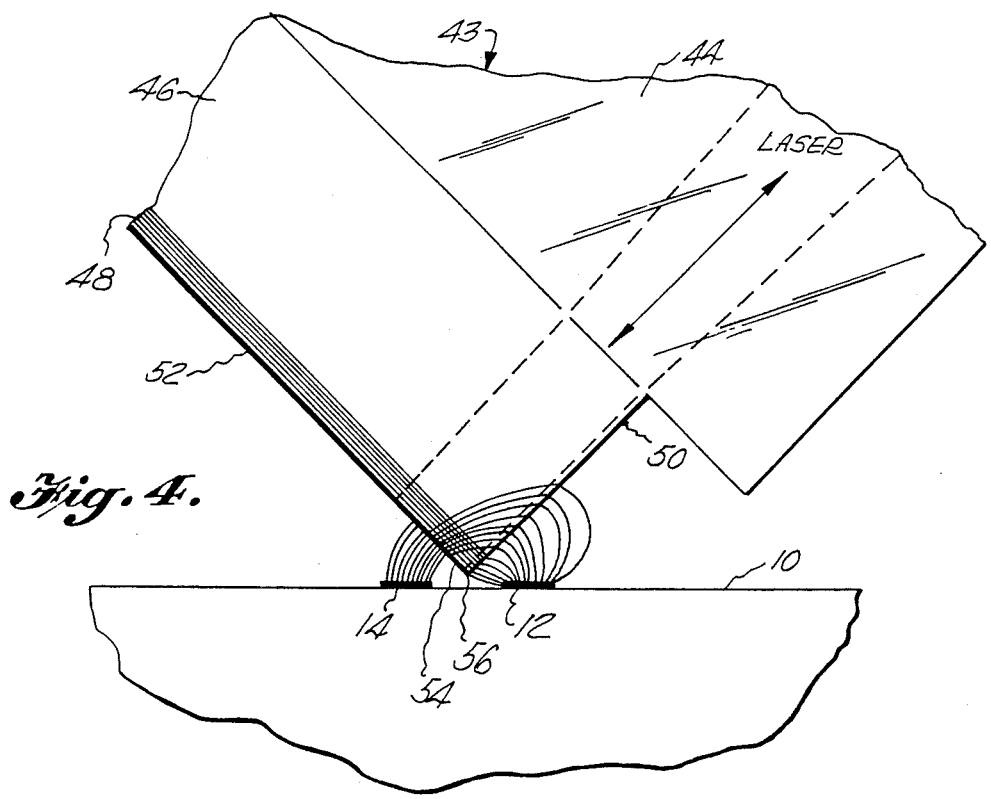
FIG. 4 is a fragmentary sectional view, the section being taken along the line 4—4 of FIG. 3.

Referring to FIGS. 3, 4 and 5, there is shown a transparent glass support body 44 of an electro-optic probe. The support structure 44 is cemented to a substrate 46 which has an outer surface on which the MQW structure 48 is grown. This structure extends to the lower end 50 of the substrate 46. This end surface 50 contains the end of the MQW structure 48. AlGaAs and an AlGaAs-GaAs MQW structure of the type shown in FIG. 3 may also be used for the MQW structure 48.

A reflective, preferably gold, reference electrode 52 (having a thickness of about 1000 Angstroms) is deposited on the outer surface of the MQW structure. This electrode necks down to the active region 54 which may be about ten microns in width along the edge 56 of the surface 52.

The optical beam is focused on this active region 54 by a lens 58. The beam is essentially perpendicular to the MQW planes. Because of the slight angle of incidence at the surface on which the electrode 52 is deposited, the reflected beam takes a separate path towards a lens 60. It will be noted that the thickness of the layers providing the MQW structure 48 is still much less than the spacing between the conductors 12 and 14. The probe is placed over but not in contact with the conductors. This is accomplished, preferably, by moving the device 10 on which the conductors 12 and 14 are disposed and leaving the probe and laser stationary while translating, elevating, rotating and otherwise moving the device 10.

The reference electrode 52 acts as a shield and screens the field from the conductor 12 from the MQW structure. All other conductors to the left of the shielding electrode 52 do not effect the measurement, since they are screened or shielded by the electrode 52. The signal of interest produces the field which is terminated by the reference electrode. The reference electrode acts also to draw the field lines up into the region of the electro-optic material. This is important when submicron electrodes are being interrogated with an about one micron spot size laser probe. Oftentimes a one micron passidation layer of $SiO_2$ is grown on top of the circuit. In this situation the reference electrode can draw the field lines out of the $SiO_2$ and into the E-O region.

The reference electrode is maintained at a potential to counteract the field whereby a polarity sensitive measurement is obtained, as will be explained in greater detail below. In any event, the laser beam may be focused to a very small spot size, for example, one micron diameter, where it reflects off the reference electrode 12 at a slight angle from the input beam as shown in FIG. 3.

Figure 6:
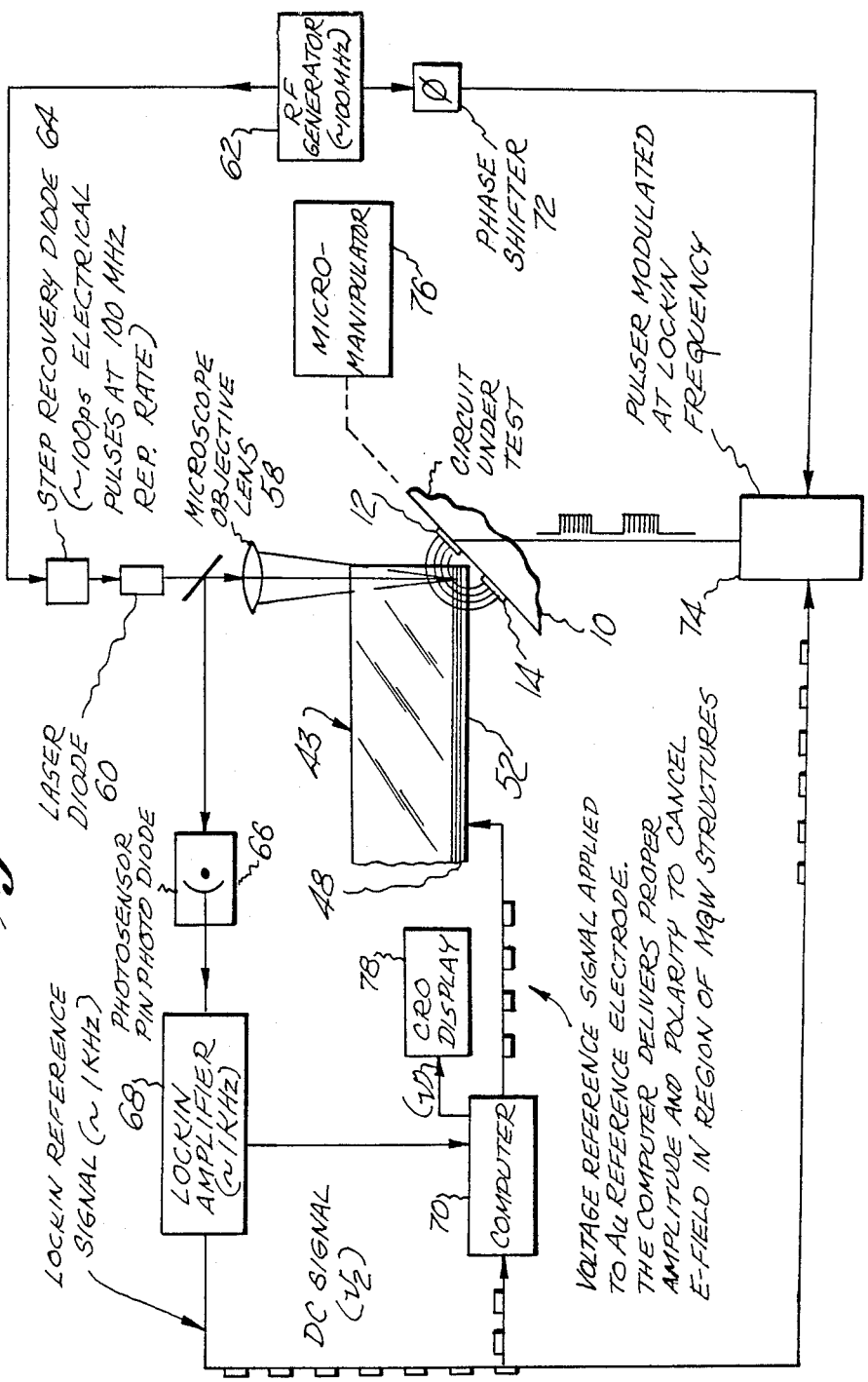
FIG. 6 is a schematic diagram illustrating a system for making electro-optic sampling measurements using the probe shown in FIGS. 3 through 5.

Referring to FIG. 6, there is shown a system using the probe of FIG. 3 with its MQW structure 48 for making measurements of the signal on the conductor 12 at a predetermined point along its length and also for electro-optical sampling to display the signal as it propagates along the conductor.

The MQW device 43 as shown in FIG. 6, is similar to the device shown in FIGS. 3 to 5. The optical beam is generated by a laser diode 60 A radio frequency (suitably approximately 100 MHz) generator 62 drives a step recovery diode 64 which produces pulses for activating the laser diode 60. In the illustrative case where the driving signal is at approximately 100 MHz, approximately 100 pS pulses at the 100 MHz rate are produced by the diode 64 and translated into optical pulses by the laser diode. These optical pulses are projected by the input lens 58, which may be a microscope objective lens, to the active region 54 where the reference electrode necks down to the edge 56 of the MQW structure. The light reflected from the MQW structure passes through the output lens 60 (see FIG. 3) to a photosensor in the form of a PIN photodiode 66, where the optical signal is converted into a corresponding electrical signal and applied to a lock-in amplifier 68. This amplifier has an oscillator for generating a lock-in reference signal; for example, a pulse train of 1 KHz repetition rate. For more information regarding lock-in amplifier systems, reference may be had to the above-cited Mourou, et al. patents. The lock-in amplifier produces a lock-in signal $V_2$ which is applied as a control signal to a feedback computer 70. The computer operates at the lock-in signal rate since the lock-in signal is applied thereto. The computer generates output signal in the form of output pulses of amplitude $V_1$. These signals go to a display 78, suitably a cathode ray oscilloscope (CRO)- and also to the reference electrode 52 where they generate a field which counteracts the field on the conductor 12.

The drive signal from the RF generator 62 is applied through a phase shifter 72 to a pulser 74 which provides the 100 MHz pulses in bursts at the lock-in frequency to the conductor 12. These 100 MHz pulses propagate along the conductor 12. The position of the probe is set by a micromanipulator 76.

As a train of pulses propagates along the conductor 12, a field proportional to the signal strength is generated which passes through the active region of the MQW structure 48. The other conductor 14 is shielded by the reference electrode 52 and does not enter into the measurement. The electroabsorption through the MQW active region varies in accordance with the field strength so that the optical beam intensity varies correspondingly. The photosensor 66 then provides a signal corresponding to the electrical signal propagating along the conductor at the time of a pulse. The lock-in amplifier results in a DC signal $V_2$ to the computer 70. The computer operates provides pulses which vary in amplitude so as to create a field which counteracts the field due to the signal on the conductor 12. This counteracting voltage may be bipolar, notwithstanding that the signal $V_2$ is unipolar.

Figure 7:
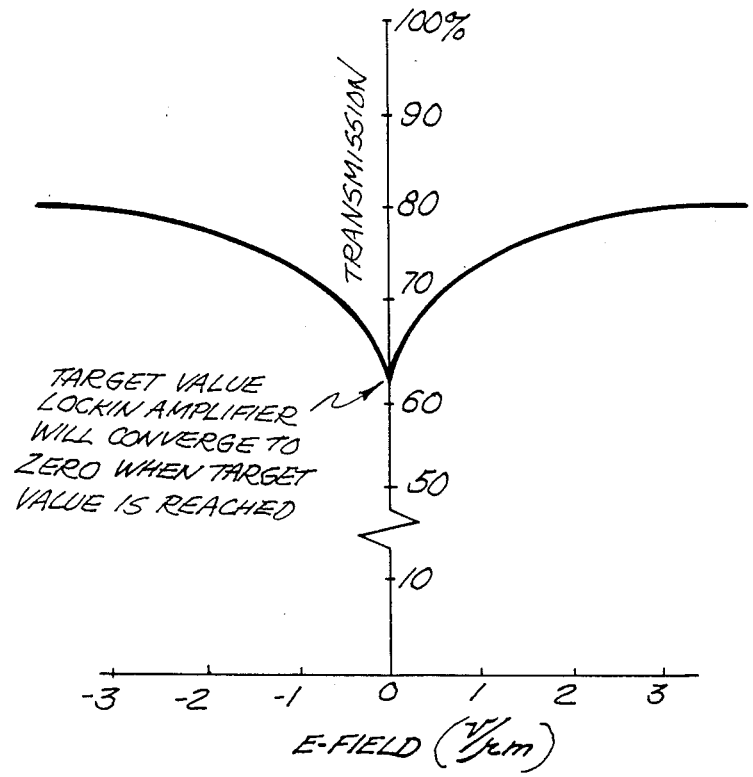
FIG. 7 is a curve showing the response of the MQW probe.

The electroabsorption characteristic as a function of field strength is shown in FIG. 7. The objective is to provide a counteracting field which will result in transmission at the cusp of the characteristic (E field=0). The computer operates in accordance with the following algorithim. In accordance with C/Pascal notation: If the absolute value of the $V_2$ is greater than a small value y corresponding to the transmission in the cusp of FIG. 7, otherwise output $V_1$. Then reduce $V_1$ while the absolute value of $V_2$ decreases. Else increase $V_1$ while the absolute value of $V_2$ decreases. By way of a specific example, assume that the counteracting voltage $V_1$ starts at 0, while the field as extracted by the probe 43 is at +3. The computer following its algorithim then reduces $V_1$, for example, to −1. This provides a net field of −4. The signal $V_2$ in response to that field increases rather than decreases. Therefore, $V_1$ on the next iteration is increased. An increase in $V_1$ back to 0 results in a decrease in $V_2$. On the next iteration $V_1$ will increase again, for example to +1, $V_2$ again decreases. On subsequent iteration, the value of $V_1$ will decrease to −3 at which time $V_2$ will not exceed y and the voltage $V_1$ will be maintained.

$V_1$ is displayed on the CRO display 78. The phase of the pulse propagating along the conductor 12 is then altered by use of the phase shifter 72. The next measurement will show the signal at a slightly delayed increment of time and another sample is displayed on the CRO. By shifting the phase shifter through successively greater increments of delay in successive steps, the entire signal will have been sampled and displayed on the CRO display 78. Alternatively, to the use of the phase shifter 72, an optical delay may be used in the optical beam path as described in the above-cited Mourou, et al. patents.

In the event that it is desired to alleviate noise, such as crosstalk from conductors to the right of the conductor 12, the measurements described above may be taken with the probe 43 positioned so that the electrode 52 is to the right of the conductor 12. This measurement corresponds to the background signal and is then substracted from the signal acquired from the initial Probe position. The precise positioning of the probe is not important provided that the neighboring electrode on the left (conductor 14) is shielded. The consequence of pulling the probe away from the electrode is a drop in the signal/noise for the acquired wave form.

Figure 8:
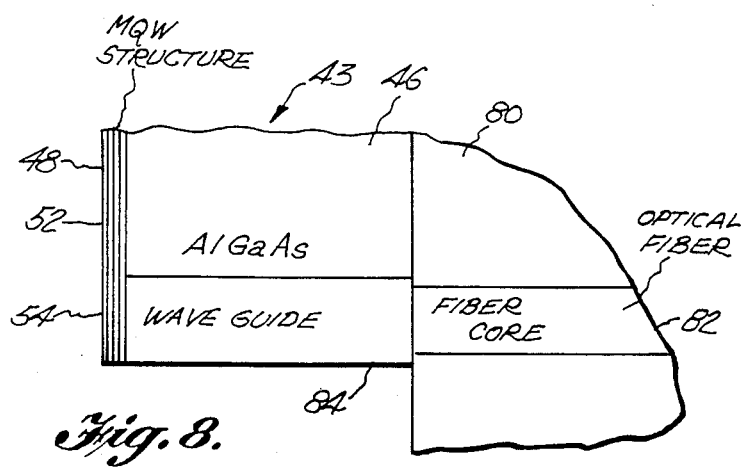
FIG. 8 is a fragmentary sectional view of a probe in accordance with a still further embodiment of the invention.

Referring to FIG. 8, there is shown a probe similar to the probe 43 in that it uses a AlGaAs substrate 46 with an MQW structure 48 thereon. An electrode 52 may also be used on the outside surface of the MQW structure. The electrode defines the active region 54 of the probe in the MQW structure. In order to deliver the optical beam to the active region 54 an optical fiber 80 having a cladding and core 82 is used to support the probe. The fiber core is in alignment and therefore in optical communicating relationship with a wave guide tunnel 84 grown in the substrate 46. The fiber core and the tunnel may be from one to five microns in diameter so as to restrict the beam to the active region 54 of the probe 43.

From the foregoing description it will be apparent that there has been provided improved electro-optic, noncontact signal measurement systems (method and apparatus) and improved probes for use in such systems. Variations and modifications in the herein described system, including its method and apparatus, within the scope of the invention, will undoubtedly suggest themselves to those skilled in the art. For example, the invention can be implemented using Pockels effect E-O crystal using a longitudinal mode of operation. Materials for this application include any epitaxially grown E-O sensitive medium including GoAs and ALGoAs. Both can be mildly ion bombarded to inhibit conductivity while maintaining the all important E-O effect. Accordingly, the foregoing description should be taken as illustrative and not in a limiting sense.

I claim:

1. The method of measuring an electrical signal on a conductor at a predetermined location spatially of said conductor which comprises the steps of placing a probe of electro-optical material in the electrical fringe field from said conductor at said location; passing a beam of light through said probe; converting said beam after passage through said probe into a second electrical signal; and generating, with a third electrical signal, a field at said probe, which cancels said fringe field, in response to said second electrical signal, said third signal providing a measurement of said first named signal.

2. The method according to claim 1 wherein said field generating step comprises the steps of placing the reference electrode on the side of said probe opposite to said conductor in intersecting relationship with said field, and applying said third signal to said reference electrode.

3. The method according to claim 2 wherein said conductor is one a plurality of conductors on a body, and further comprising the steps of locating of said probe between said one conductor and those conductors of said plurality of conductors disposed on one side of said one conductor with said electrode between said one side of said one conductor and those of said plurality of conductors on said one side thereof, carrying out said beam passing, converting and generating steps to provide a signal component which is the measurement of the contribution to said third signal of said those of said plurality of conductors, locating said probe on the side of said conductor opposite to said one side with said probe between said opposite side and said reference electrode, carrying out said beam passing, converting and generating steps to provide said third signal, and subtracting from said third signal said component to provide the measurement of said first signal.

4. The method according to claim 2 wherein said passing step is carried out by reflecting said beam at said reference electrode, and said converting step comprises photodetecting said reflected beam.

5. The method according to claim 1 wherein said conductor is one of a plurality of conductors spaced from each other on a substrate and said probe has a MQW structure of with between opposite sides thereof less than the spacing between said conductors, and said placing step is carried out by placing said MQW structure between said conductors.

6. The method according to claim 5 wherein said location has dimensions in the micron range, and further comprising the steps of depositing a reference electrode in the form of a layer of conductive material having an area in the micron range on one of the opposite sides of said MQW structure, said placing step being carried out to locate said area between said conductors in the field from said one conductor.

7. The method according to claim 6 wherein said beam passing step is carried out by focusing said beam on said area so that said beam passes through said MQW structure, is reflected by said electrode at said area and passes again through said MQW structure, and said converting step is carried out on the beam after it passes again through said area.

8. The method according to claim 1 further comprising the steps of propagating said first signal along said conductor, and generating said beam in pulses.

9. The method according to claim 8 further comprising the steps of relative delaying in phase one of the pulses of said beam and said signal on said conductor with respect to each other, measuring samples upon occurrence of each of said pulses, and displaying said third signals from said samples.

10. A submicron electro-optic electrical field probe which comprises a substrate having a side surface and an end surface with an edge, a multi quantum well (MQW) structure on said side surface having a plurality of layers parallel to said side surface and extending to said edge, said structure having a width not exceeding about a micron to define the end surface of said probe through which said field passes into a region of said MQW structure, means for passing a beam of light through said MQW structure limited to said region.

11. The probe according to claim 10 further comprising a superstrate disposed on said MQW structure, said superstrate having a side surface on which said MQW structure is disposed and an end surface which also defines the end surface of said probe.

12. The probe according to claim 10 further comprising temperature control means in thermally coupled relationship with said MQW structure.

13. The probe according to claim 10 further comprising a transparent member on which said substrate is disposed.

14. The probe according to claim 13 further comprising a prism on said transparent member having surfaces for refracting said beam through said region along a path generally paralleling said end surface.

15. The probe according to claim 10 further comprising a layer of conductive material disposed on the side of said MQW structure opposite to said substrate and extending to said end surface.

16. The probe according to claim 15 wherein said region is disposed along said edge and said conductive material layer necks toward said end surface into an area about equal to the area of said region, said beam passing means including means for directing said beam upon said area of said conductive material layer where said beam is reflected therefrom.

17. The probe according to claim 16 wherein said directing means comprises an optical wave guide extending through said substrate along said end surface to said region of said MQW structure.

18. The probe according to claim 17 further comprising an optical fiber through which said beam propagates, said wave guide and fiber being coupled in light communicating relationship with each other.

19. A system for measuring an electrical signal on a conductor at a predetermined location spatially of said conductor which comprises a probe of electro-optical material disposed in the electrical fringe field from said conductor at said location, means for passing a beam of light through said probe, means for converting said beam after passage through said probe into a second electrical signal, means for generating with a third electrical signal a field at said probe which counteracts said fringe field in response to said second electrical signal, and means for providing a measurement of said first named signal from said third signal.

20. The system according to claim 19 wherein said field generating means comprises a reference electrode on the side of said probe opposite to said conductor so that it intersects said field, and means for applying said third signal to said reference electrode.

21. The system according to claim 2 wherein means are provided for reflecting said beam at said reference electrode and said converting means is responsive to said reflected beam.

22. The system according to claim 21 wherein said probe has a multi quantum well (MQW) structure of width between opposite sides thereof less than about one micron.

23. The system according to claim 22 wherein said location has dimensions in the micron range and further comprising a reference electrode and shield in the form of a layer of conductive material having an area in the micron range on one of the opposite sides of said MQW structure, said shield being disposed to shield said MQW structure from fields other than the field from said conductor.

24. The system according to claim 23 further comprising means for focusing said beam on said area so that said beam passes through said MQW structure, is reflected by said electrode at said area and passes again through said MQW structure, said converting means being responsive to said reflected beam after passing through said MQW structure.

25. The system according to claim 19 further comprising means for propagating said first signal along said conductor, and means for generating said optical beam in pulses.

26. The system according to claim 25 further comprising means for delaying one of said pulses of said beam and said signal which is applied to said conductor in phase with respect to each other, and means for measuring samples upon occurrence of each of said pulses and displaying said third signal from said samples.

* * * * *